(12) United States Patent
Dai et al.

(10) Patent No.: US 6,989,299 B2
(45) Date of Patent: Jan. 24, 2006

(54) METHOD OF FABRICATING ON-CHIP SPACERS FOR A TFT PANEL

(75) Inventors: Yuan-Tung Dai, Chung-Li (TW); Tsung-Neng Liao, Taichung Hsien (TW); Chun-Chi Lee, Taipei (TW)

(73) Assignee: Forhouse Corporation, Taichung Hsien (TW)

( * ) Notice: Subject to any disclaimer, the term of this patent is extended or adjusted under 35 U.S.C. 154(b) by 5 days.

(21) Appl. No.: 10/373,623

(22) Filed: Feb. 25, 2003

(65) Prior Publication Data

US 2004/0175867 A1    Sep. 9, 2004

(51) Int. Cl.
  *H01L 21/00* (2006.01)
  *H01L 21/84* (2006.01)

(52) U.S. Cl. ............... 438/164; 438/32; 438/39; 438/98; 438/459

(58) Field of Classification Search .......... 438/30, 438/33, 39, 40, 32, 164, 459, FOR 388, FOR 485, 438/FOR 138, 98, 977, 928

See application file for complete search history.

(56) References Cited

U.S. PATENT DOCUMENTS

| | | | |
|---|---|---|---|
| 5,472,889 A * | 12/1995 | Kim et al. | 438/28 |
| 5,618,739 A * | 4/1997 | Takahashi et al. | 438/158 |
| 5,886,761 A * | 3/1999 | Sasaki et al. | 349/122 |
| 5,914,763 A * | 6/1999 | Fujii et al. | 349/149 |
| 6,118,502 A * | 9/2000 | Yamazaki et al. | 349/45 |
| 6,400,440 B1 * | 6/2002 | Colgan et al. | 349/160 |
| 6,411,346 B1 * | 6/2002 | Numano et al. | 349/39 |
| 2001/0019371 A1 * | 9/2001 | Zavracky et al. | 349/5 |

* cited by examiner

*Primary Examiner*—David Coleman
*Assistant Examiner*—Julio J. Maldonado
(74) *Attorney, Agent, or Firm*—William E. Pelton, Esq.

(57) ABSTRACT

A method for fabricating on-chip spacers for a TFT panel exposes a photoresist layer on top of the TFT panel using two exposure processes, one through the bottom of the TFT and the other through a mask over the TFT panel. The exposure process through the bottom exposes all photoresist covering windows on the TFT panel and leaves all photoresist corresponding to an opaque grid corresponding a TFT driving circuit. A second exposure process through a mask above the photoresist leaves part of the photoresist in the opaque grid unexposed. The exposed photoresist is removed leaving on-chip spacers only on the opaque grid. Therefore, the on-chip spacers can not affect the display quality and can be easily formed on a high dpi TFT panel.

19 Claims, 10 Drawing Sheets

METHOD OF FABRICATING ON-CHIP SPACERS FOR A TFT PANEL

BACKGROUND OF THE INVENTION

1. Field of the Invention

The present invention relates to a method of fabricating on-chip spacers for a TFT (thin transistor film) panel, and more specifically to a simple and cheap method for easily and accurately fabricating on-chip spacers on an opaque region of a TFT panel.

2. Description of Related Art

A simple method of fabricating a TFT display device includes steps of.

(1) preparing a first glass;

(2) forming a driving circuit and pixel electrodes on the first glass;

(3) applying an orientation film on the pixel electrodes to from a TFT plane;

(4) defining a frame region;

(5) forming spacers in the frame region;

(6) attaching a second panel to the first glass;

(7) filling the frame region with liquid crystal; and (8) pressing the first and second panels together to securely combine them.

Beside the basic steps of the method we mentioned above, this method can further add other steps depending on display requirements, such as display function, driving circuit, etc. FIG. 10 illustrates a TFT panel with a matrix active driving circuit composed of transistors (52), data lines (53), scan lines (54) and pixel electrodes (55). The transistors (52), data lines (53) and scan lines (54) are opaque and form an opaque regions (501) that separate multiple window regions (500).

Further, the spacers (60) for providing holding liquid crystal space between the first and second glasses are formed on the TFT driving circuit. There are two common methods used to fabricate the spacer on the TFT panel. One of which is a spraying technique as a first method, and the other of which is an on-chip spacer technique as a second method.

In the first method, the spacers (60) are sprayed on the TFT panel (50) so the first method is easy. However, the number and location of spacers (60) on the TFT panel (50) cannot be accurately controlled during spraying the spacers (60). Therefore, the spacers (60) may be deposited on windows (500) of the TFT panel (50) and cause a light leakage fault to affect display quality.

In the second method, the spacer can be formed only on the opaque region of the TFT panel. The second method has steps of (a) coating the TFT panel with photoresist;

(b) transferring a spacer pattern corresponding to the opaque region (501) on the photoresist by a stepper or scanner exposure machine;

(c) removing exposed photoresist to form the spacer pattern on the TFT panel; and (d) curing the photoresist to form the spacer.

The second method can accurately form the spacers on the opaque region of the TFT panel by exposing the photoresist technique. However, the spacers on a high resolution TFT display device is formed by an expensive, high-precision exposure machine. Therefore, the second method of fabricating spacers has higher cost than the first method.

The present invention provides a simple, cheap and accuracy method of fabricating on-chip spacers on high dpi TFT display devices to mitigate or obviate the aforementioned problems.

SUMMARY OF THE INVENTION

An objective of the present invention is to provide a simple method of fabricating on-chip spacers on a TFT display device to decrease fabricating cost of the on-chip spacer and the TFT display device.

Another objective of the present invention is ensure that display quality of the TFT display device is not degraded by the spacer being positioned on an opaque region of a TFT panel.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
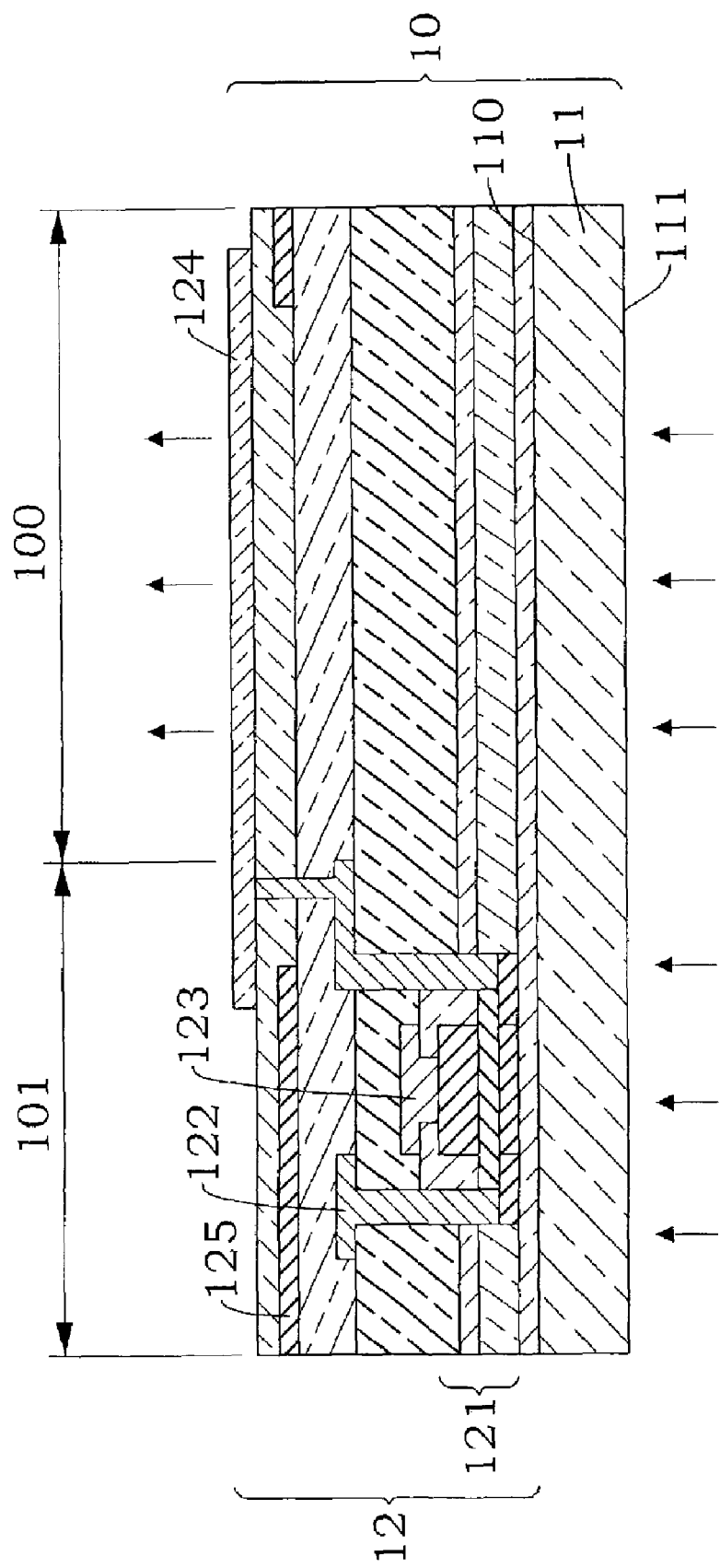
FIG. 1 is a cross sectional side plan view of one portion of a TFT panel without a spacer.
Figure 8:
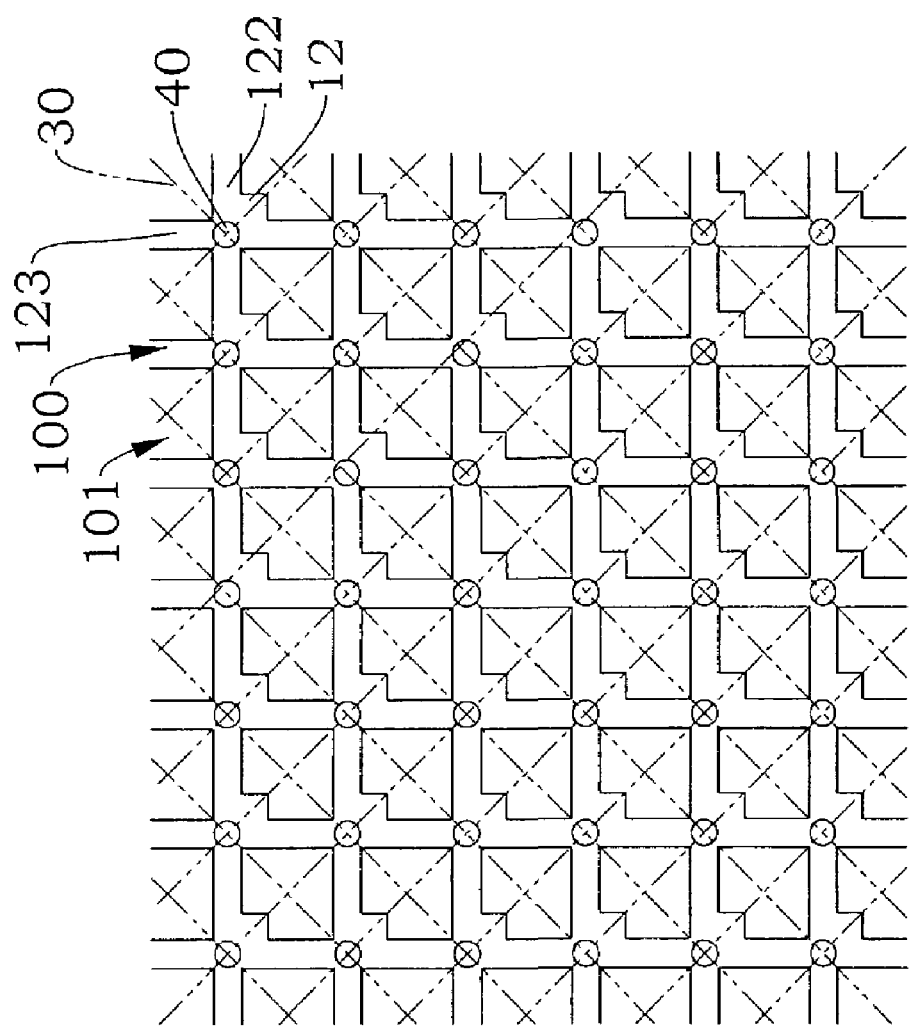
FIG. 8 is a top plan view of a portion of a TFT panel with the spacers in FIG. 7.

With reference to FIG. 1, a TFT panel (10) has a transparent substrate (11) and a TFT driving circuit (12). The transparent substrate (11) has a top face (110) and a bottom face (111). The transparent substrate (11) can be glass or high polymer. The TFT driving circuit (12) is formed on the top face (110) of the transparent substrate (11). The TFT driving circuit (12) includes thin film transistors (121), capacitors (not shown), data lines (122), scan lines (123) and pixel electrodes (124). With further reference to FIG. 8, the thin film transistors (121), the data lines (122) and scan lines (123) are opaque. The data lines (122), the scan lines (123) and the thin film transistors (121) are positioned in the TFT panel (10) to form an opaque grid (101). Further, to prevent light from leaking around edges of the opaque grid (101), a black mask (125) corresponding to the opaque grid (101) is applied to the substrate (11) above the thin film transistors (121), the data lines (122) and the scan lines (123). Therefore, the TFT panel (10) comprises the opaque grid (101) and individual windows (100) filling the opaque grid (101).

With reference to FIG. 2 to FIG. 7, a method is used to fabricate on-chip spacers on the opaque grid (101) in accordance with the present invention.

Figure 2:
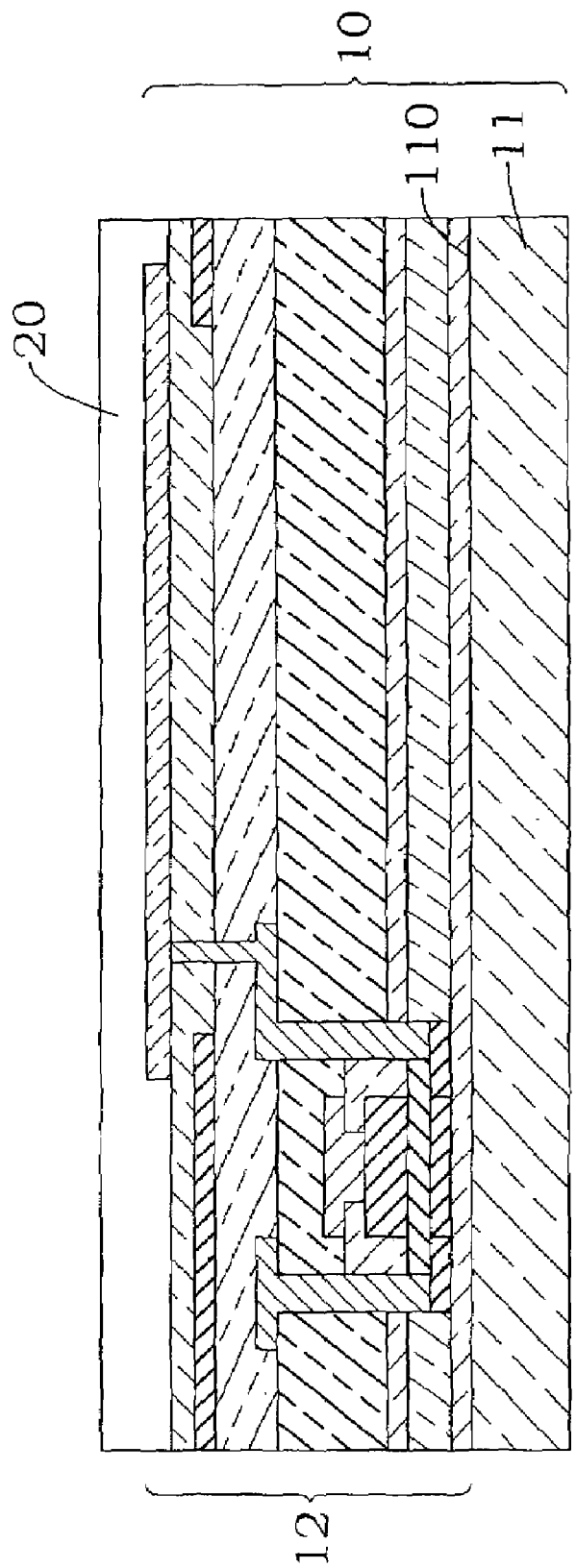
FIG. 2 is a cross sectional side plan view of one portion of a TFT panel coated with a photoresist in accordance with the present invention.

In FIG. 2, a photoresist layer (20) is formed on the entire TFT driving circuit (12).

Figure 3:
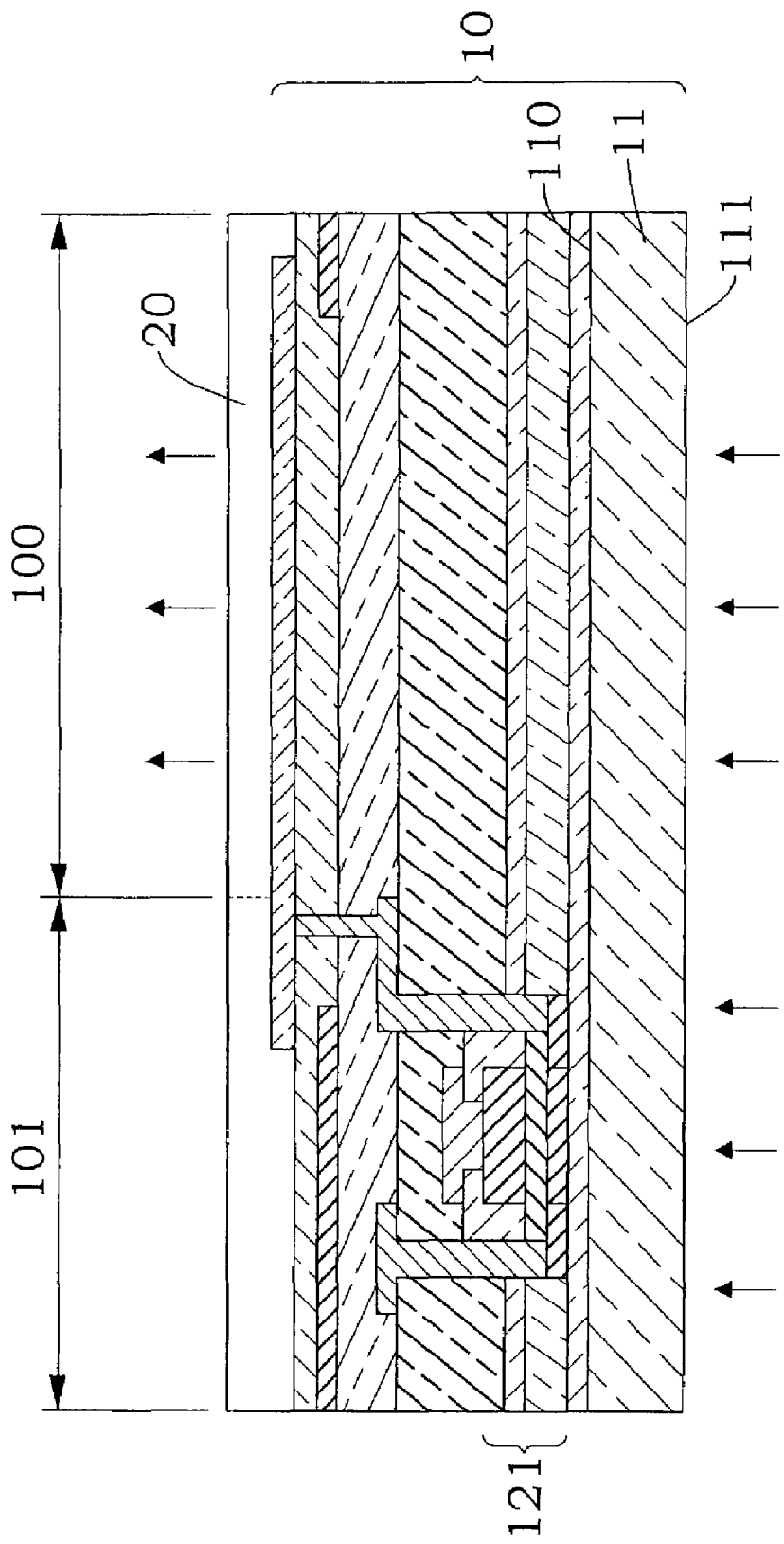
FIG. 3 is a cross sectional side plan view of one portion of a TFT panel in a first exposure process in accordance with the present invention.
Figure 4:
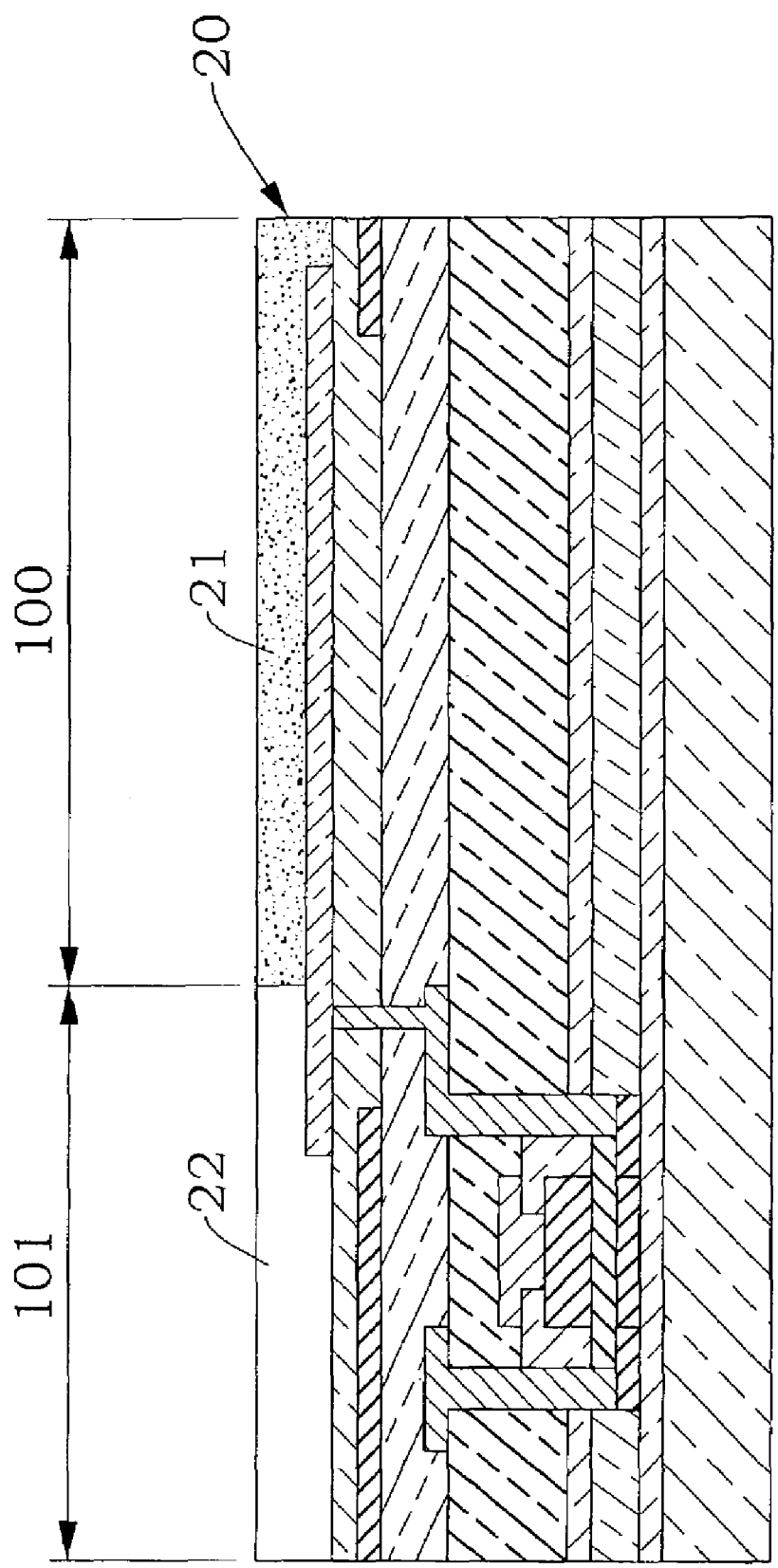
FIG. 4 is a cross sectional side plan view of one portion of a TFT panel with exposed photoresist in accordance with the present invention.
Figure 5:
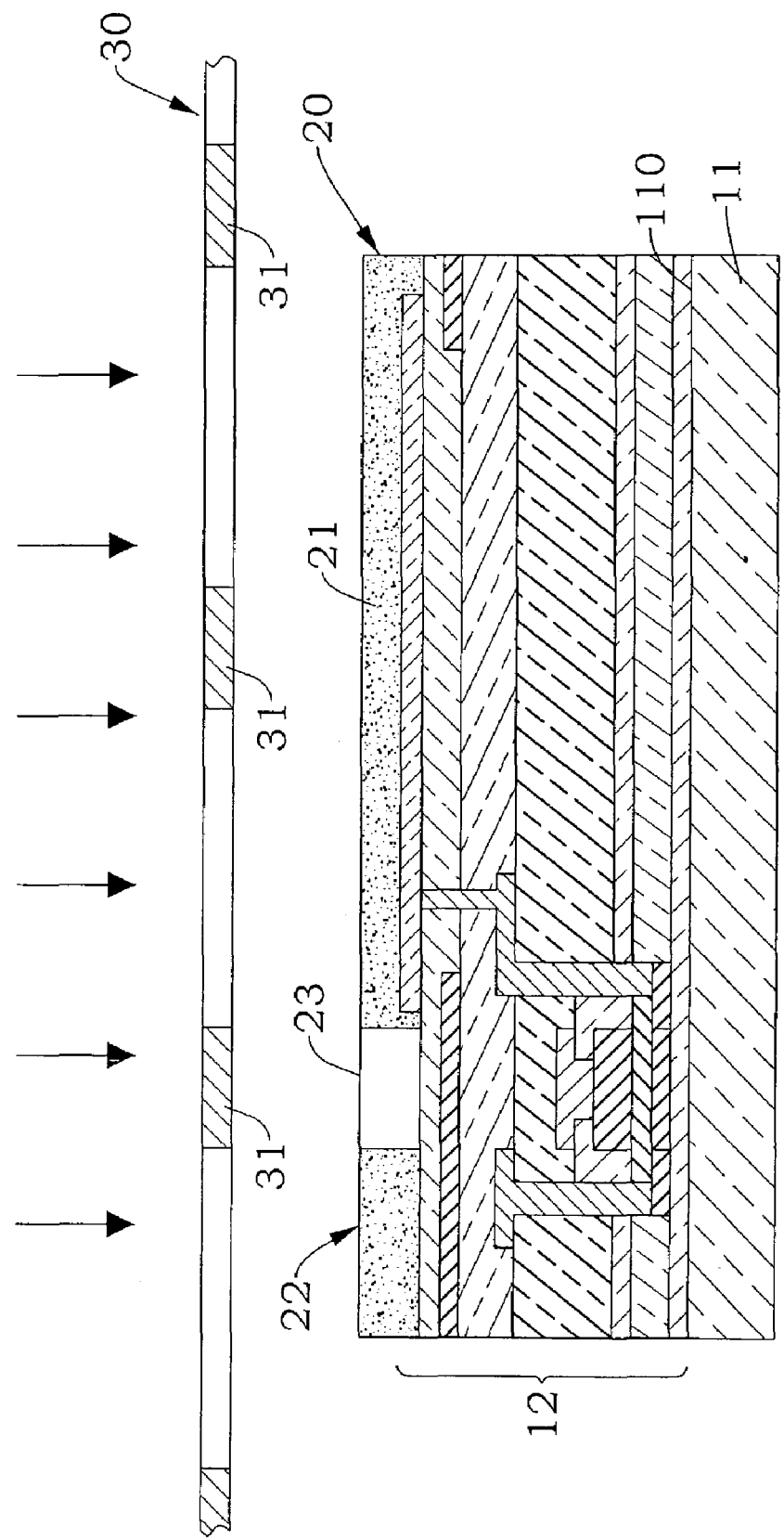
FIG. 5 is a cross sectional side plan view of one portion of a TFT panel in a second exposure process in accordance with the present invention.
Figure 6:
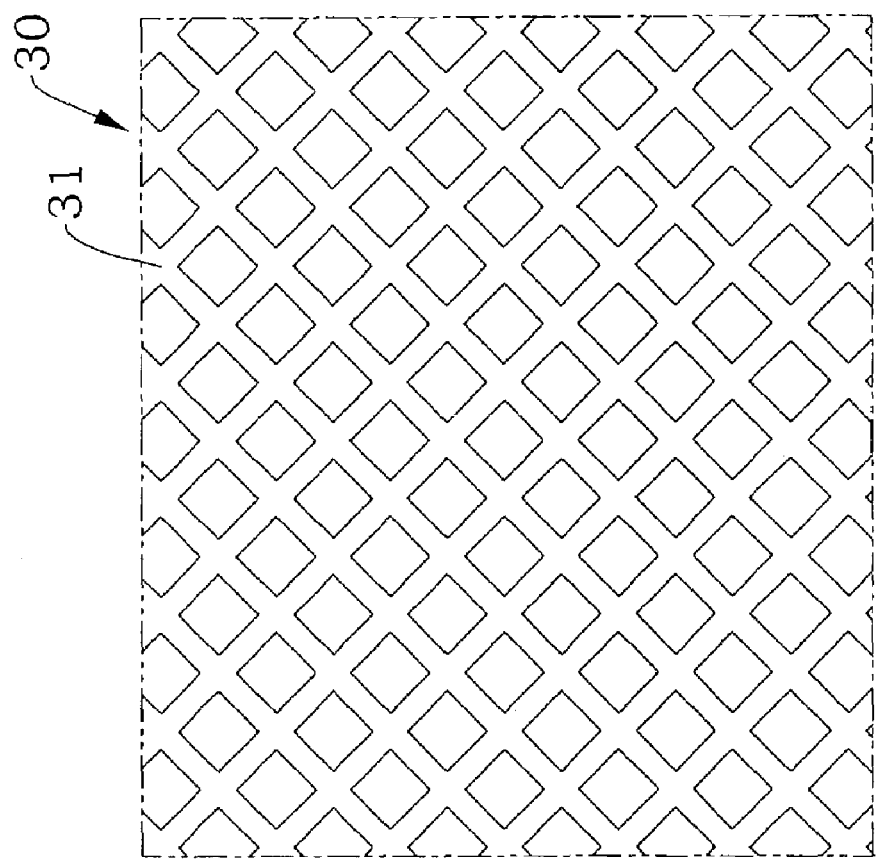
FIG. 6 is a top plan view of one portion of a mask for the second exposure in FIG. 5.

In FIGS. 3 and 4, the photoresist layer (20) corresponding to the windows (100) is exposed by a first exposure process. That is, a light of the fist exposing passes through the bottom face (111) of the substrate (11) to form exposed photoresist (21) corresponding to the windows (100). On the contrary, the photoresist (20) corresponding to the opaque grid (101) is not exposed and forms an unexposed photoresist grid (22);

In FIGS. 5 and 6, a mask (30) aligns to the TFT driving circuit on top face of the substrate to prepare to execute a second exposure process. The mask has a pattern (31) that overlaps the opaque grid (100) and positioning the mask (30) above the photoresist (20). In the second exposure process, a light passes through the mask (30) to light on the TFT driving circuit (12).

Figure 7:
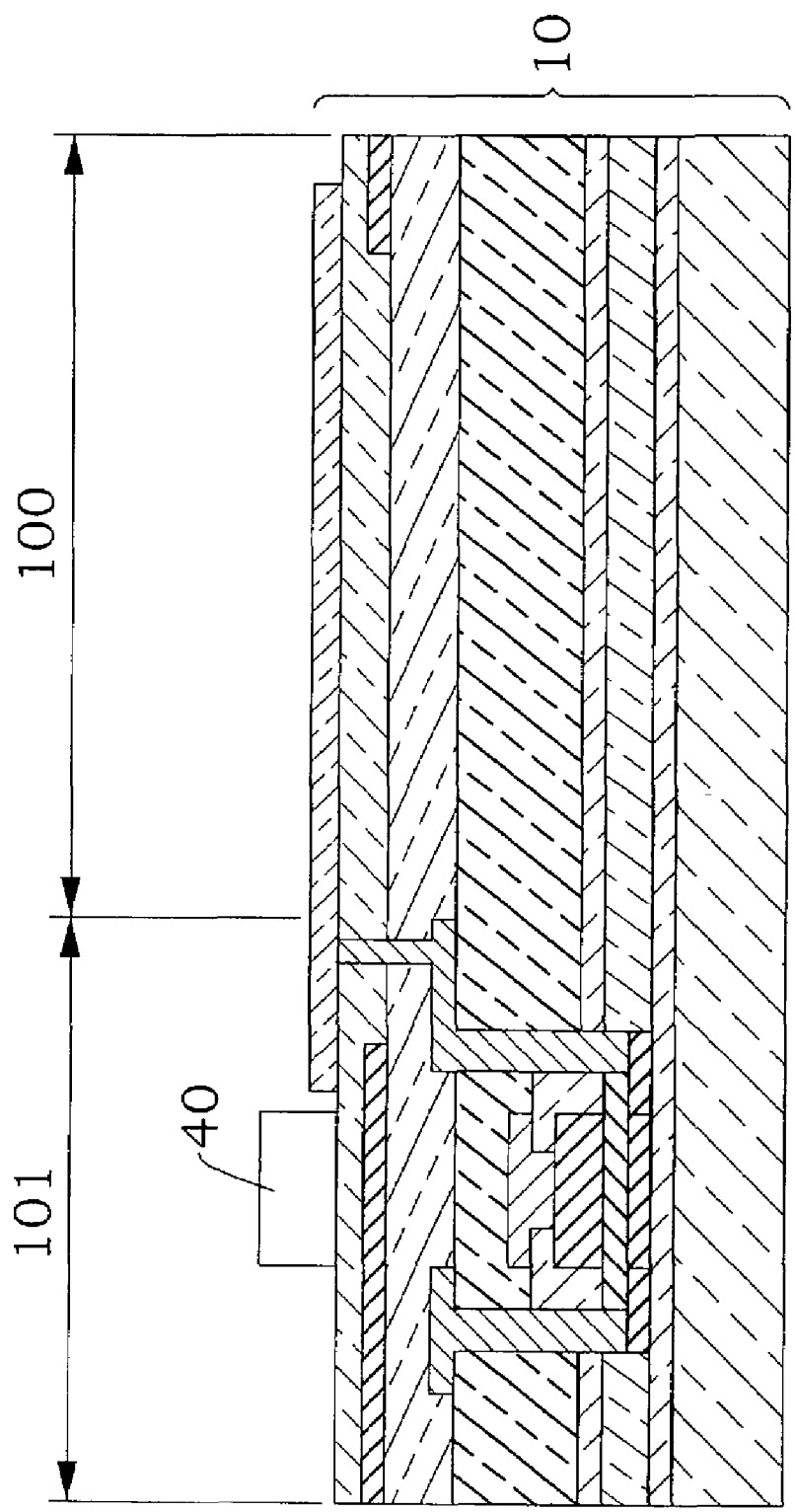
FIG. 7 is a cross sectional side plan view of one portion of a TFT panel with a spacer.

In FIG. 5, the photoresist (20) through the mask (30) positioned above the photoresist (20) with the light of the second exposure process forms exposed photoresist (23) in the unexposed photoresist grid (22); and In FIG. 7, the exposed portions of the photoresist (not shown) are removed to from on-chip spacers (40) in the opaque grid (101) by development process.

Based on the forgoing description, the opaque grid (101) is used as a mask (30) in one exposure process to limit locations of the on-chip spacers (40) to the opaque grid (101). Therefore, the on-chip spacers (40) cannot be formed in the windows (100), as shown in FIG. 8. The other mask (30) having a pattern (31) overlapping the opaque grid (101) is used to form complete on-chip spacers (40) on the TFT panel (10). The mask (30) is not restricted to a specific size or pattern but only needs to intersect the opaque grid (101). The pattern of the mask may be a multi-rhombus shape or geometrically arranged squares.

Since the method of forming on-chip spacers (40) in accordance with the present invention is dependent on the combination of two exposure processes, the order in which FIGS. 3, 4 and 5 are performed does not affect the successfully formation of the on-chip spacers (40). That is, the step in FIG. 5 can be first executed before the steps in FIGS. 3 and 4.

Further, an organic or inorganic transparent layer can be applied between the photoresist (20) and the TFT driving circuit (12). The organic or inorganic transparent layer is transferred to the on-chip spacer by the photoresist (20), which is processed by the forgoing steps and an etching process. That is, the method further has steps of removing the organic or inorganic transparent layer except portions covered by the photoresist (20) and removing the unexposed photoresist (23) from the residual organic or inorganic transparent layer to form on-chip spacers.

The on-chip spacers are located in the opaque grid by the TFT driving circuit, so that the method in accordance with the present invention can be applied to a high dpi TFT panel. Since the method does not require an expensive and accurate exposure machine to from on-chip spacers, the method fabricates on-chip spacers at a low cost.

Figure 9A:
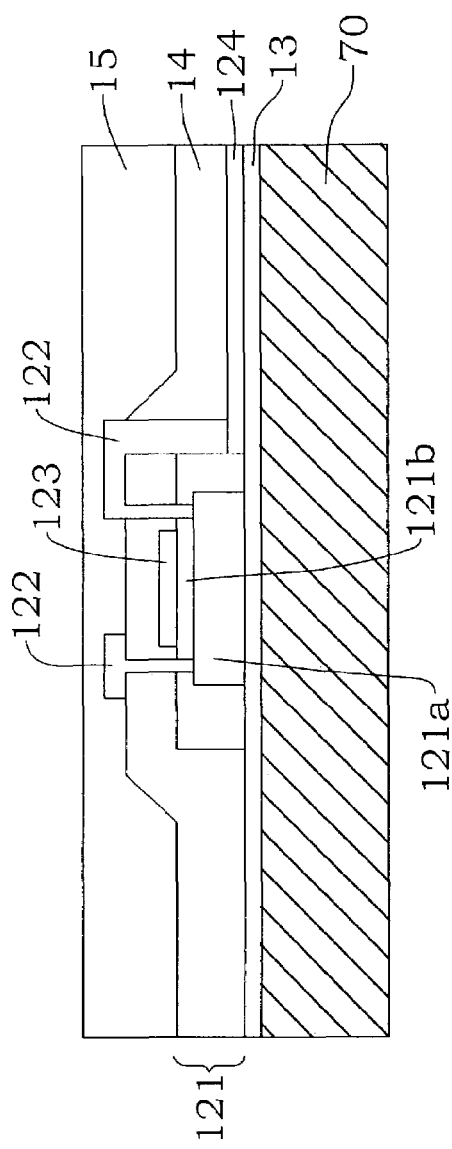
FIGS. 9A and 9B are cross sectional side plan view of one portion a TFT panel.
Figure 9B:
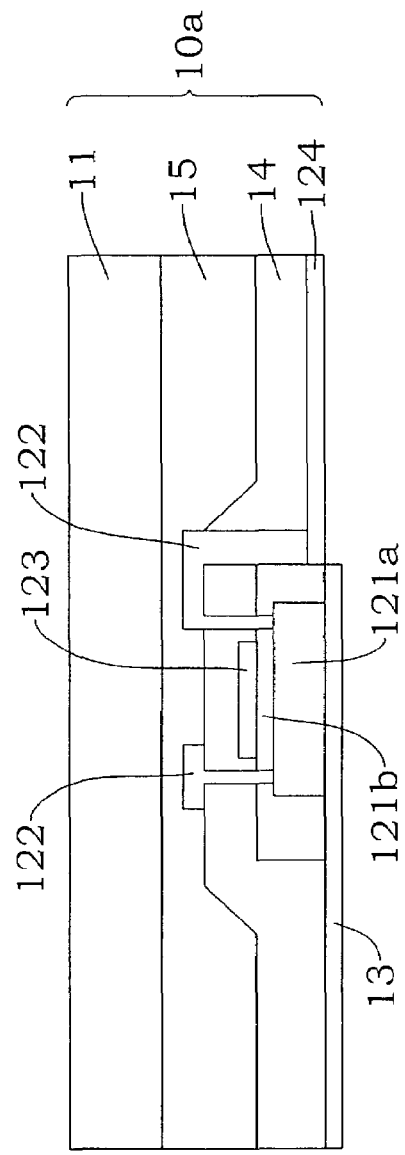
Figure 10:
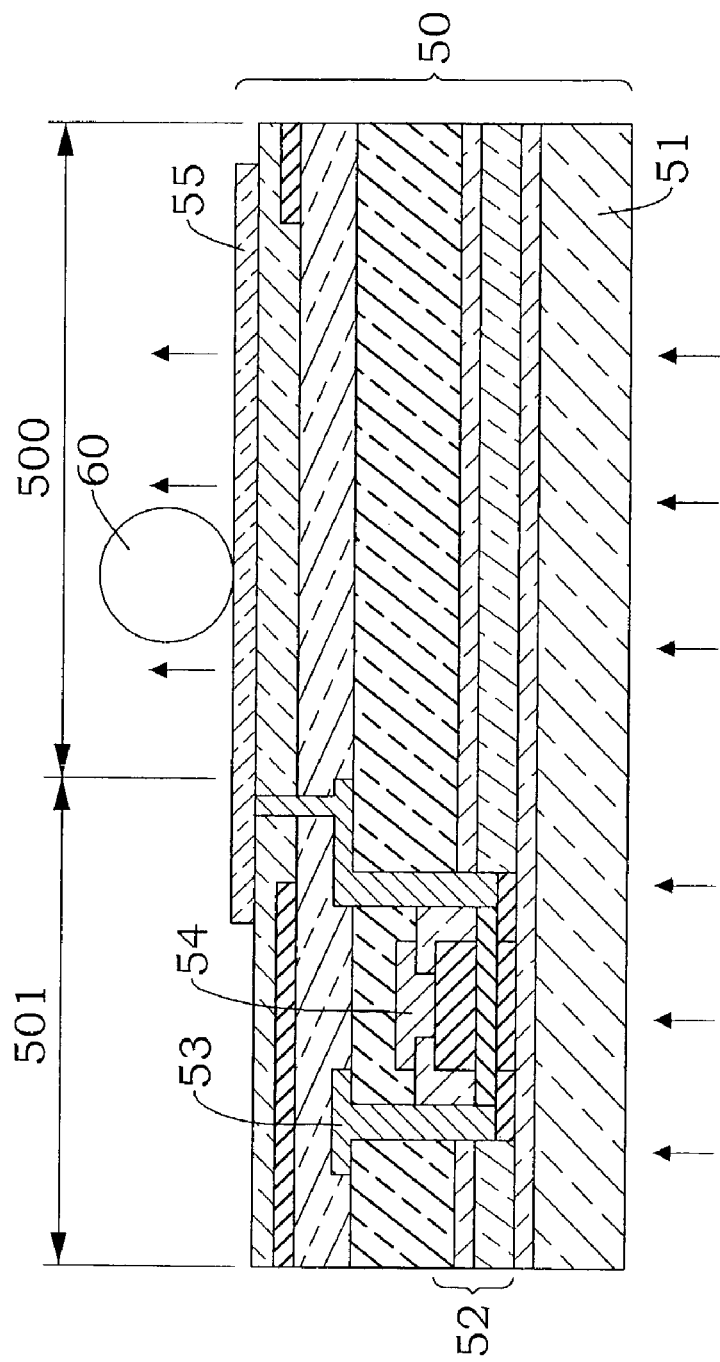
FIG. 10 is a cross sectional side plan view of a conventional TFT panel with a spacer.

With reference to FIGS. 9A and 9B, a process of fabricating the TFT panel (10a) is further introduced that the TFT driving circuit of the TFT panel (10a) has good electric characteristics. The process includes following steps of:

(a) preparing a temporary substrate (70) adapted to form semiconductors with good electric characteristics;

(b) forming an etching stop layer (13) on the temporary substrate (70);

(c) forming semiconducting films (121a) on the etching stop layer (13) to define a drain, a source and an active region;

(d) forming gate oxide layers (121b) on the semiconducting films (121a) to complete TFTs (121);

(e) forming pixel electrodes (124) on the etching stop layer (13) adjacent to the TFTs (121);

(f) forming a first metal layer (123) on the gate oxide layer (121b);

(g) covering the first metal layer (123), gate oxide layer (121b) and pixel electrodes (124) with an inner layer (14);

(h) forming a second metal layer (122) through the inner layer (14) and the gate oxide layer (121b) to connect to the pixel electrode (124) to the semiconducting layer (121a) and to connect adjacent TFTs (121).

(i) covering the second metal layer (122) and inner layer (14) with a passivation layer (15);

(j) bonding a display panel (11) on the passivation layer (15); and (k) removing the temporary substrate (70) and portions of the etching stop layer (13) to expose the pixel electrode (124).

Using the temporary substrate forms the TFT driving circuit with good electric characteristics and then a display panel is bonded on the TFT driving circuit film by the transferring step to complete the TFT panel. Therefore, the TFT panel can have TFTs with good electric characteristics. In addition, the pixel electrodes are directly formed on the etching stop layer not on passivation layer, so a bottom face of each pixel electrode on the etching stop layer is flatter than on the passivation layer. Thus, the TFT panel with the flat exposed faces of the pixel electrodes has a good display quality.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of fabricating on-chip spacers for a TFT panel comprising a substrate having a top and bottom face and a TFT driving circuit with a top face formed on the top face of the substrate, windows and an opaque grid composed of portions of the TFT driving circuit, the TFT panel being fabricating by a process comprising the steps of:

preparing a temporary substrate adapted to form semiconductors;

forming an etching stop layer on the temporary substrate;

forming thin film transistors (TFTs) on the etching stop layer, wherein each thin film transistor has a gate oxide layer;

forming pixel electrodes on the etching stop layer adjacent to the TFTs;

forming a first metal layer on the gate oxide layer;

covering the first metal layer, the gate oxide layer and pixel electrodes with an inner layer;

forming a second metal layer through the inner layer to connect the pixel electrodes to the TFT and to adjacent TFTs;

covering the second metal and inner layer with a passivation layer;

bonding a display panel on the passivation layer; and removing the temporary substrate and portions of the etching stop layer to expose the pixel electrodes, the method of fabricating on-chip spacers for the TFT panel comprising:

applying a photoresist layer on the top face of the TFT driving circuit;

preparing a mask having a pattern that overlaps a shape of the windows;

exposing the photoresist by the mask and the opaque grid; and removing the exposed photoresist to form on-chip spacers where unexposed photoresist on the TFT driving circuit exists only in the opaque grid.

2. The method of fabricating on-chip spacers as claimed in claim 1, wherein in the step of exposing the photoresist, a first light irradiates to the photoresist from the bottom face of the substrate to form an unexposed photoresist grid corresponds to the opaque grid; and then a second light irradiates to the unexposed photoresist grid by the mask.

3. The method as claimed in claim 2, wherein before the photoresist is applied to the TFT driving circuit, an organic transparent layer is applied to the top of the TFT driving circuit, and then the photoresist is applied to the organic transparent layer, wherein the method further comprises:

removing the organic transparent layer except portions under the unexposed photoresist by an etching process; and removing the unexposed photoresist from the residual organic transparent layer to form on-chip spacers.

4. The method as claimed in claim 2 wherein before the photoresist is applied to the TFT driving circuit, an inorganic transparent layer is applied to the top of the TFT driving circuit, and then the photoresist is applied to the inorganic transparent layer; wherein the method further comprises:

removing the inorganic transparent layer except portions under the unexposed photoresist by an etching process; and removing the unexposed photoresist from the residual inorganic transparent layer to form on-chip spacers.

5. The method as claimed in claim 2, wherein the TFT driving circuit comprises transistors, data lines, scan lines, capacitors and pixel electrodes, wherein the opaque grid is defined by the transistors, data lines and scan lines.

6. The method as claimed in claim 2, wherein the opaque grid further is defined by a black mask deposited on the substrate above the transistors, data lines and the scan lines.

7. The method as claimed in claim 2, where the transparent substrate is made of glass material.

8. The method as claimed in claim 2, where the transparent substrate is made of high polymer material.

9. The method as claimed in claim 2, where the pattern is a multi-rhombus shape.

10. The method as claimed in claim 1, wherein the forming the TFTs step further comprises:

(a) forming semiconducting films on the etching stop layer to define a drain, a source and an active region; and (b) forming gate oxide layers on the semiconducting films to complete TFTs, wherein the second metal layer passes through the inner layer and the gate oxide layer to connect the pixel electrodes to the semiconducting film.

11. The method of fabricating on-chip spacers as claimed in claim 1, wherein the step of exposing the photoresist, a first light irradiates to the photoresist through the mask to form an unexposed photoresist, that is uncovered by the pattern of the mask, and then a second light faced to the bottom face of the substrate irradiates to the unexposed photoresist through the windows.

12. The method as claimed in claim 11, wherein before the photoresist is applied to the TFT driving circuit, a organic transparent layer is first applied to the top of the TFT driving circuit and then the photoresist is applied to the organic transparent layer; wherein the method further comprises removing the organic or inorganic transparent layer except portions under the unexposed photoresist by an etching process; and removing the unexposed photoresist from the residual organic transparent layer to form on-chip spacers.

13. The method as claimed in claim 11, wherein before the photoresist is applied to the TFT driving circuit a inorganic layer is first applied to the top of the TFT driving circuit and then the photoresist is applied to the inorganic transparent layer; wherein the method further comprises removing the inorganic transparent layer except portions under the unexposed photoresist by an etching process; and removing the unexposed photoresist from the residual inorganic transparent layer to form on-chip spacers.

14. The method as claimed in claim 11, wherein the TFT driving circuit comprises transistors, data lines, scan lines, capacitors and pixel electrodes, wherein the opaque grid is defined by the transistors, data lines and scan lines.

15. The method as claimed in claim 11, wherein the opaque grid further is defined by a black mask deposited on the substrate above the transistors, data lines and the scan lines.

16. The method as claimed in claim 11, where the transparent substrate is made of glass material.

17. The method as claimed in claim 11, where the transparent substrate is made of glass high polymer material.

18. The method as claimed in claim 11, where the pattern is a multi-rhombus shape.

19. The method as claimed in claim 11, wherein the forming the TFTs step further comprises:

(a) forming semiconducting films on the etching stop layer to define a drain, a source and an active region; and (b) forming gate oxide layers on the semiconducting films to complete TFTs, wherein the second metal layer passes through the inner layer and the gate oxide layer to connect the pixel electrodes to the semiconducting film.

* * * * *